(12) United States Patent
Kleijnen et al.

(10) Patent No.: US 11,359,774 B2
(45) Date of Patent: Jun. 14, 2022

(54) FLEXIBLE LIGHT-EMITTING DIODE LIGHTING STRIP WITH INTERPOSER

(71) Applicant: Lumileds Holding B.V., Schiphol (NL)

(72) Inventors: Christian Kleijnen, Aachen (DE); Barbara Muelders, Aachen (DE); Lex Kosowsky, San Jose, CA (US); Manuel Grave, Aachen (DE); Udo Karbowski, Aachen (DE); Georg Henninger, Aachen (DE); S. Rao Peddada, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/039,273

(22) Filed: Jul. 18, 2018

(65) Prior Publication Data

US 2020/0025342 A1   Jan. 23, 2020

(51) Int. Cl.
  *F21S 4/22*  (2016.01)
  *H01L 33/36*  (2010.01)
  (Continued)

(52) U.S. Cl.
  CPC .............. *F21S 4/22* (2016.01); *H01L 33/36* (2013.01); *F21V 23/005* (2013.01); *H05K 1/189* (2013.01)

(58) Field of Classification Search
  CPC ........ F21S 4/22; H01L 33/36; H05B 33/0842; H05K 1/189; F21V 23/005
  See application file for complete search history.

(56) References Cited

U.S. PATENT DOCUMENTS 6,113,248 A * 9/2000 Mistopoulos ........... F21V 23/06
                                                    362/219
6,566,824 B2 * 5/2003 Panagotacos ............. F21V 5/04
                                                    315/183
(Continued)

FOREIGN PATENT DOCUMENTS

AU       2007240145 A1    6/2009
CN        101852360 A    10/2010
(Continued)

OTHER PUBLICATIONS

Written Opinion of the International Searching Authority dated Jan. 23, 2020 for PCT International Application No. PCT/EP2019/068386.

(Continued)

*Primary Examiner* — Arman B Fallahkhair
(74) *Attorney, Agent, or Firm* — Volpe Koenig

(57) ABSTRACT

The invention describes a flexible lighting strip comprising a multitude of light-emitting diodes arranged in at least two groups. Each group comprises at least two light-emitting diodes arranged in an electrical series connection. The at least two groups are arranged in parallel to an anode track and a cathode track. The at least two groups are arranged in a longitudinal arrangement such that a last light-emitting diode of a first group is arranged next to a first light-emitting diode of a second group. The anode track and the cathode track each consist of a wire line having substantially circular wires that are bent to receive compressive and/or tensile stress. The electrical circuit provides a third wire line having a substantially circular wire as a center line arranged between the outer lines. At least one light-emitting diode of every group is mounted on an interposer which contracts all three wire lines.

19 Claims, 7 Drawing Sheets

(51) Int. Cl.
 *H05K 1/18* (2006.01)
 *F21V 23/00* (2015.01)

(56) References Cited

U.S. PATENT DOCUMENTS

| | | | | |
|---|---|---|---|---|
| 6,886,398 | B2* | 5/2005 | Tsuyuki | F02M 25/0818 |
| | | | | 73/114.38 |
| 8,807,796 | B2* | 8/2014 | Li | H05B 33/0803 |
| | | | | 315/312 |
| 9,318,665 | B2 | 4/2016 | Yamada | |
| 9,583,469 | B2* | 2/2017 | Hsieh | H01L 24/81 |
| 10,132,453 | B2* | 11/2018 | Hamby | F21S 4/24 |
| 10,557,377 | B2 | 2/2020 | Nishii et al. | |
| 2005/0146870 | A1* | 7/2005 | Wu | F21S 4/22 |
| | | | | 362/227 |
| 2009/0296382 | A1 | 12/2009 | Maier | |
| 2014/0268779 | A1* | 9/2014 | Sorensen | F21K 9/232 |
| | | | | 362/249.06 |
| 2015/0377460 | A1 | 12/2015 | Li | |

FOREIGN PATENT DOCUMENTS

| | | | |
|---|---|---|---|
| WO | 2017/157753 | A1 | 9/2017 |
| WO | 2019/170489 | A1 | 9/2019 |

OTHER PUBLICATIONS

International Search Report dated Jan. 23, 2020 for PCT International Application No. PCT/EP2019/068386.
Communication pursuant to Article 94(3) EPC dated May 14, 2020 for European Patent Application No. 19737739.3.

* cited by examiner

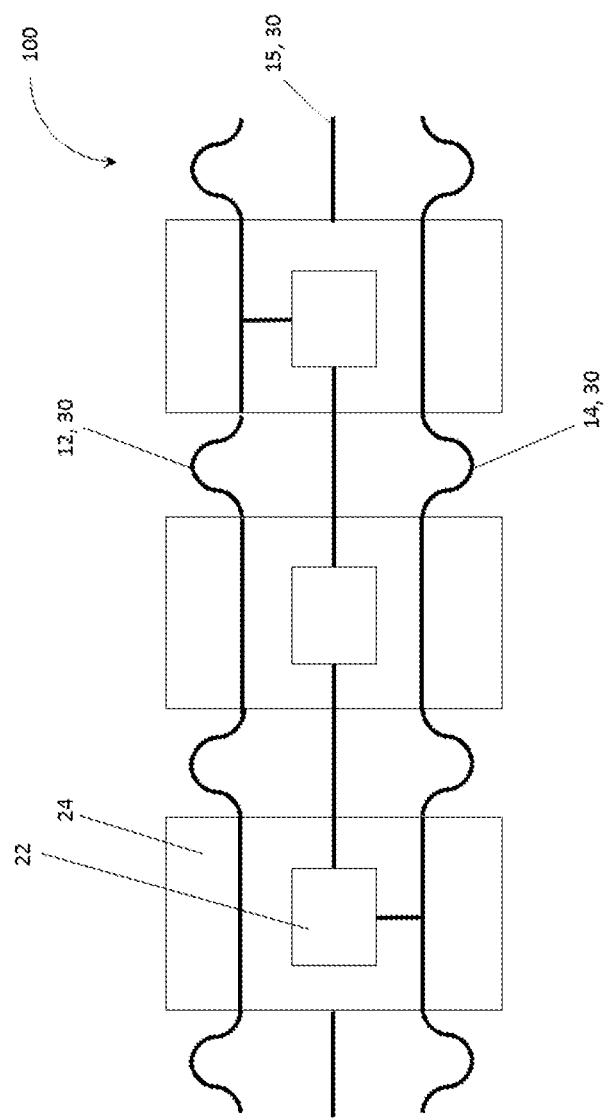

FLEXIBLE LIGHT-EMITTING DIODE LIGHTING STRIP WITH INTERPOSER

FIELD OF THE INVENTION

The invention relates to a flexible lighting strip comprising a multitude of light-emitting diodes (LEDs) in a longitudinal arrangement. The invention further relates to a light assembly comprising such a flexible lighting strip. The invention finally relates to a vehicle rear light or vehicle front light comprising such a vehicle light assembly.

BACKGROUND OF THE INVENTION

Flexible light-emitting diode bands are used for an ever-increasing number of lighting applications. In many cases, an optical element is arranged in front of a light-emitting diode to alter the light emission, such as for instance a lens, a reflector and/or a collimator and/or a light guide to obtain an emitted light beam of desired properties. Bendability or conformability of the light-emitting diode band allows fitting in a corresponding application as, for example, vehicle light assemblies which are integrated in curvy automobile body frames. Reliability of the flexible light-emitting diode band is a key feature especially for automotive applications.

US 2009/0296382 A1 discloses, for example, a flexible light-emitting diode band. The flexible light-emitting diode band has a basis for attaching the flexible light-emitting diode band and at least partially light-transmissive covering connectable to the basis, wherein in a state connected to each other the basis and the covering form an accommodation cavity for the flexible light-emitting diode band.

SUMMARY OF THE INVENTION

It is an object of the present invention to provide a flexible lighting strip comprising a multitude of light-emitting diodes with improved reliability, whereby a simple and improved mechanically symmetric configuration shall be provided.

The invention is defined by the independent claims. The dependent claims define advantageous embodiments.

According to a first aspect a flexible lighting strip comprising a multitude of light-emitting diodes is provided. The light-emitting diodes are arranged in at least two groups. Each group comprises at least two light-emitting diodes arranged in an electrical series connection. The at least two groups are arranged in an electrical circuit having at least an anode track and a cathode track as outer lines, wherein the at least two groups of light-emitting diodes are arranged parallel to the anode track and the cathode track. The at least two groups are arranged in a longitudinal arrangement such that a last light-emitting diode of a first group is arranged next to a first light-emitting diode of a second group. Each of the outer lines consists of a wire line having a substantially circular cross section, whereby the wires of the outer lines comprise bent zones that are capable to receive and absorb compressive and/or tensile stress by elastic deformation. The electrical circuit provides a third wire line having a substantially circular wire as a center line arranged between the outer lines. The third wire line is preferable a center wire line.

Using the circular wire form, forces imposed on the flexible lighting strip as for instance present during thermo-mechanical cycle stress testing −40 C/125 C 5 sec/30 min drain/dwell duration typically required for automotive applications are equally distributed within the circular wire. The circular wire form is therefore able to withstand and absorb stresses better as a square lead frame line and allows to pass the stress tests required for automotive applications.

Preferably at least one light-emitting diode of every group is mounted on an interposer, whereby the interposer advantageously contacts all three wire lines. The bent outer wire zones are then positioned between these interposers. Preferably the interposer acts as heat-spreader. The interposer may carry one or more further electrical components, for instance a resistor.

Routing for electrical connection may be different for at least two interposers in the group—for instance a pad layout and via positions may differ.

For two or more light-emitting diodes within one group, three different kinds of interposer with varied electrical routings are preferred.

Especially for three and more light-emitting diodes within one group three different kinds of interposer with varied electrical routings are preferred.

The third wire may be bent as well.

In a preferred embodiment of the invention the third wire line is segmented.

In an advantageous embodiment of the invention the third wire line is substantially made from straight wire segments.

In a preferred embodiment of the invention at least one segment of the third wire line connects two non-current carrying coupling pads of the adjacent interposers of two neighboring groups by a non-current carrying wire segment.

The outer wires bends are preferable pointing outwards in one plane.

The center wire bend is preferably not in a plane defined by the outer wires.

In an advantageous embodiment of the invention the center wire bend is perpendicular to the plane defined by outer wires.

In a preferred embodiment of the invention one of the interposers is positioned at one outer end of all groups and is connected directly or indirectly to an external power line.

Soldering the light-emitting diode on an interposer, leads to a simpler and mechanically more symmetric configuration of the flexible lighting strip. The light-emitting diode may then be provided as an SMD component, omitting the need to electrically connect the light emitting diode by ribbon or wire bonding.

The wires may be soldered to the interposer as well. The attachment of the wires may be done in one step in parallel to the light emitting diode to interposer attach. This may also be done in two sub-sequent process steps. The sequence of soldering—wire or light-emitting diode attached to the interposer first can be chosen. One solder point may then be double re-flown.

In an advantageous embodiment of the invention one solder point, many solder points or all solder points are double re-flown.

Preferably, the light emitting diode is soldered to the interposer first and the wires are soldered to the interposer in a second reflow process. In consequence, the solder joint of the light emitting diode then is re-flown twice.

In another preferred embodiment of the invention, the electrical wires are attached to the interposer with a different process, as for instance by laser welding or by resistance welding. The light emitting diodes may be attached prior or after the welding process.

Especially the outer wires preferably consist of a ductile material.

Advantageously the outer wires consist of an electrical conducting material, as are for instance Cu metal, Cu alloys, as for example CuFe2P or CuNiSi alloys, or other alloys and mixtures thereof.

The middle-wire preferably consists of a ductile material. The outer wires may have zones that can receive compressive and tensile stress, respectively. The bend zones of the outer wires are capable to absorb compressive and/or tensile stress by giving way.

Since the interposer contacts all three wire lines, the flexible lighting strip is mechanically stabilized.

In the flexible lighting strip, when three light-emitting diodes are connected in series between the outer lines, at least one first light-emitting diode connects one outer line to a first inner segment, the first inner segment connects via at least one second light-emitting diode to a second inner segment, and the second inner segment connects via at least one third light-emitting diode to the second outer line. While the outer lines may be continued along the three light emitting diode segment, the inner line may be segmented not to short circuit single light emitting diodes.

To have two light-emitting diodes in series, the middle interposer may be omitted. To have four or more light-emitting diodes connected in series, the middle interposer may be duplicated according to the number of light-emitting diodes desired to be in the string.

The center wire of the inner line may be composed of segments to minimize length variations of the lighting strip during thermal cycling. The inner wire may comprise a bend for stress relieve as well. For geometrical reasons the bend preferably sticks out of the plane defined by the outer wires. The center wire may also comprise bent zones comparable to the ones present on the outer wires to allow stress compensation during thermal cycling. Preferably, the bent zone is protruding from the plane defined by the two outer wires to reduce the risk of unwanted electrical contact between the inner and the outer wires. Preferably the inner wire bend is positioned perpendicular to the plane defined by the two outer wires.

A straight or bent wire segment may also connect the last light-emitting diode of the first group to the first light-emitting diode arranged next it. Not all center wires need to carry current.

The interposer may have two electrical coupling pads on a first side for connection to the light-emitting diode. Thereby, anode and cathode pad may differ to correctly supply the light-emitting diodes with current.

Moreover, the interposer may have four coupling pads on a second side for connection to the wires.

The two coupling pads on the first side of the interposer may be connected to two of the coupling pads of the second side of the interposer via vias Preferably, the interposer is made from a printed circuit board, as for instance Cu-IMS, Al-IMS or FR4. Alternately, he interposer may be made out of a ceramic material, as for instance Al2O4 or AlN.

Preferably, the light-emitting diode and the wires are soldered with a lead-free solder as for instance SAC305 to the interposers. The material in use is not limited to this choice; further solders as other SAC grades or AuSn solder may be employed as well to.

Moreover, additional electrical components may be mounted on the interposer. Such additional electrical components are for instance TVS diodes, resistors to adjust the light and voltage output of the light-emitting diodes according to their bin code and future performance or logic components that can switch on and of all or individual or single light-emitting diodes in the string or in the strings.

According to a further aspect of the invention a lighting device is provided. The lighting device comprises the flexible lighting strip according to any embodiment described above.

Preferably the flexible lighting strip is encapsulated within a holder.

In an advantageous embodiment of the invention the flexible lighting strip is encapsulated in Silicone material.

According to a further aspect of the invention a vehicle light assembly is provided. The vehicle light assembly comprises the flexible lighting strip according to any embodiment described above. The vehicle light assembly comprises an electrical interface. The electrical interface is arranged to couple the vehicle light assembly to an external power supply.

For example a vehicle rear light or vehicle front light may comprise the vehicle light assembly in accordance with any embodiment described above.

The vehicle light assembly may, for example, be used as welcome light, as interior lighting, in daytime running light (DRL), tail light, stop light or turn light.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings. In the drawings:

FIG. 5 shows a top view of three SMD light-emitting diodes on an interposer with light-emitting diodes mounted.

FIG. 6b shows the electrical scheme of light-emitting diode string of FIG. 6a.

In the Figures, like numbers refer to like objects throughout. Objects in the Figs. are not necessarily drawn to scale.

DETAILED DESCRIPTION OF EMBODIMENTS

Various embodiments of the invention will now be described by means of the Figures.

Figure 1:
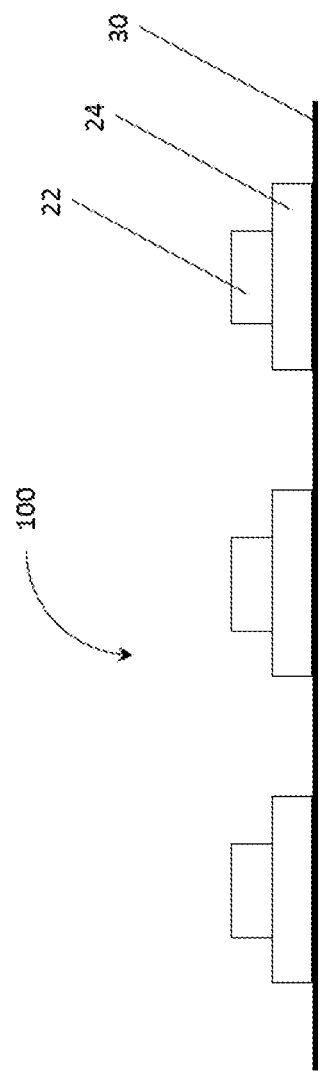
FIG. 1 shows a side view of three SMD light-emitting diodes on an interposer.

FIG. 1 shows a side view of a group of three SMD light-emitting diodes 22 on an interposer 24 as section of a flexible light-emitting diode band with multitude of light-emitting diodes in a longitudinal arrangement. The light-emitting diodes 22 are connected in an electrical series connection in line by wire 30 and as a group in parallel to other three light-emitting diodes groups.

Figure 2:
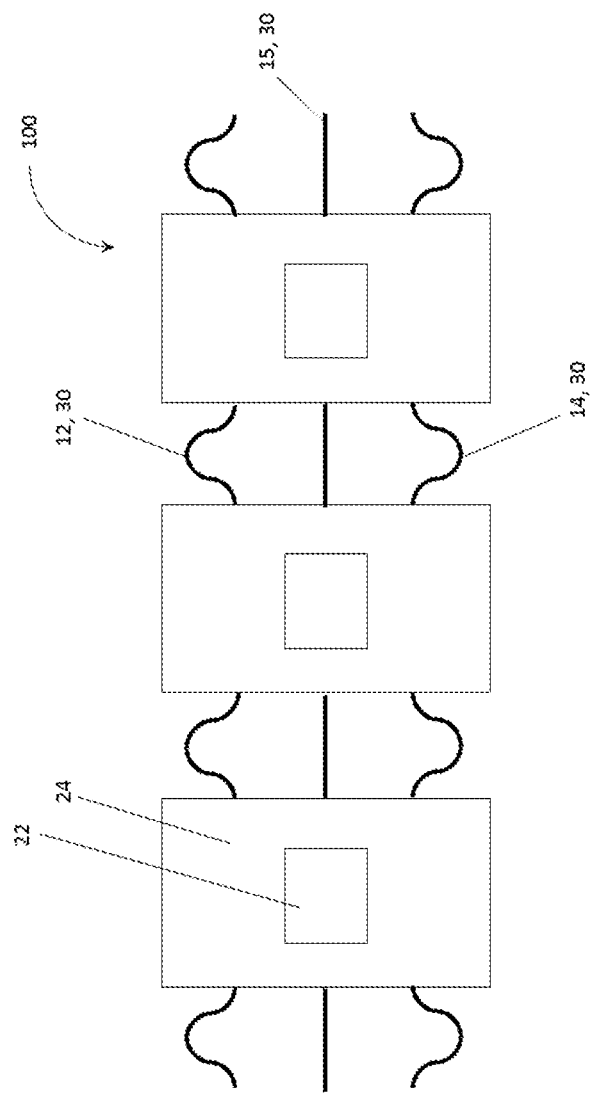
FIG. 2 shows a top view of three SMD light-emitting diodes on an interposer with light-emitting diodes mounted.

FIG. 2 shows a top view of three SMD light-emitting diodes 22 on interposers 24 with light-emitting diodes 22 mounted as section of a flexible light-emitting diode band with multitude of light-emitting diodes in a longitudinal arrangement. The light-emitting diodes 22 are arranged in an electrical circuit having at least an anode track 12 and a cathode track 14 as outer lines 12, 14. Each of the outer lines 12, 14 consists of a wire line having substantially circular wires 30, whereby the wires of the outer lines 12, 14 are bent to receive compressive and/or tensile stress. The electrical circuit provides a third wire line 15 having a substantially circular wire 30 as a center line arranged between the outer lines 12, 14. The interposers 24 contact all three wire lines 12, 14, 15.

Figure 3:
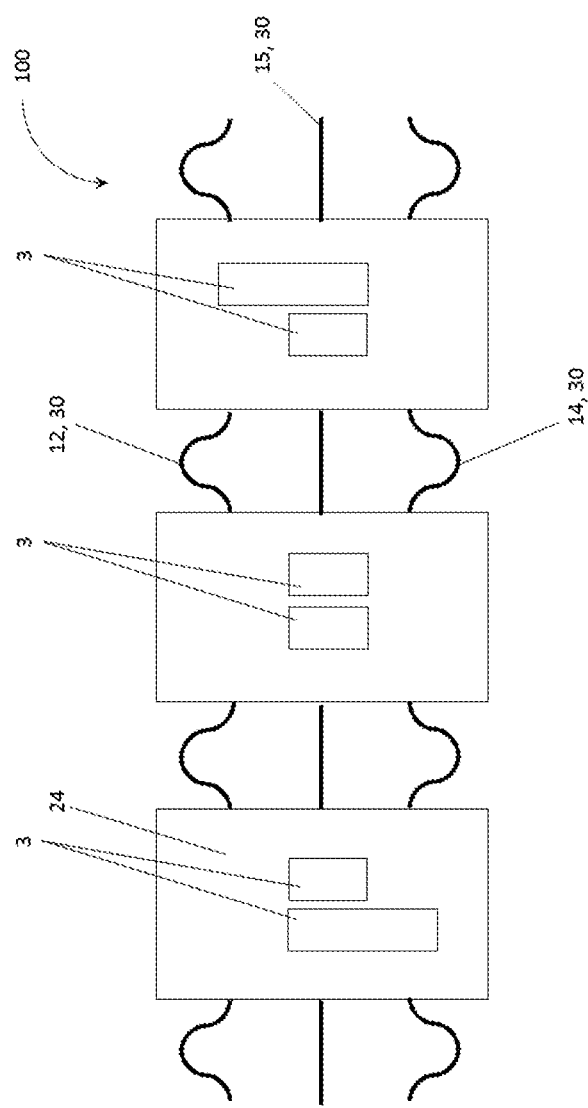
FIG. 3 shows a top view top view of three SMD light-emitting diodes on an interposer with light-emitting diodes removed.

FIG. 3 shows a top view of three SMD light-emitting diodes 22 on an interposer 24 with light-emitting diodes 22 removed as section of a flexible light-emitting diode band with multitude of light-emitting diodes in a longitudinal arrangement. The interposers 24 have two electrical coupling pads 3 on a first side for connection to the light-emitting diodes 22. Thereby, anode pad 3 and cathode pad 3 differ to correctly orient the light-emitting diodes 22. Since the light-emitting diodes 22 are removed, the electric coupling pads 3 are made visible. The electric coupling pads 3 connect to wire pads on the bottom of the interposers 24 via vias (not shown).

Figure 4:
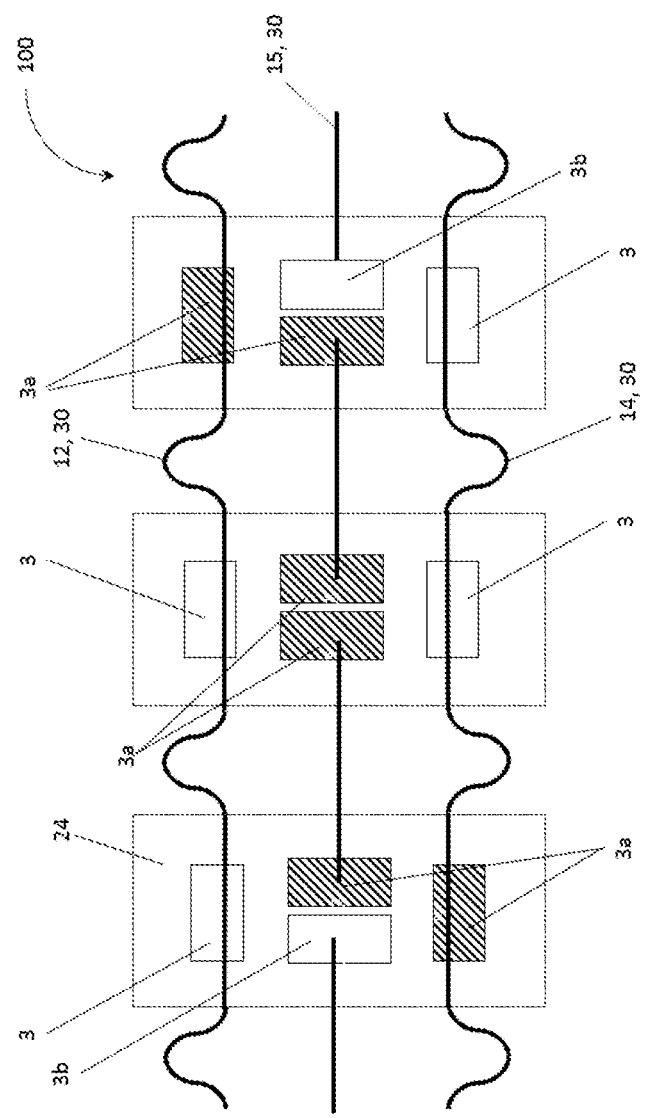
FIG. 4 shows a top view of three SMD light-emitting diodes on an interposer, cut at wire pad level.

FIG. 4 shows a top view of three SMD light-emitting diodes 22 on interposers 24, cut at wire pad level, as section of a flexible light-emitting diode band with multitude of light-emitting diodes in a longitudinal arrangement. The coupling pads (3, 3a, 3b) for the electrical connection are shown as squares. The hatched coupling pads 3a connect with the top surface of the interposer 24 via vias (not shown). The non-current carrying coupling pads 3b do not carry current and have only a mechanical function.

FIG. 5 shows a top view of three SMD light-emitting diodes 22 on interposers 24 as section of a flexible light-emitting diode band with multitude of light-emitting diodes 22 in a longitudinal arrangement. The electrical connection of the light-emitting diodes 22 is schematically included. In the flexible lighting strip 100, three light-emitting diodes 22 are connected in series between the outer lines 12, 14. A first light-emitting diode 22 is connected to the cathode track 14 to a first inner segment, the first inner segment is connected via a second light-emitting diode 22 to a second inner segment, and the second inner segment is connected via a third light-emitting diode to the anode track 12. The outer lines 12, 14 are continued, however the inner line which is the third wire line 15 is segmented. Moreover, the wire 30 of the third wire line 15 is composed of straight segments.

Figure 6A:
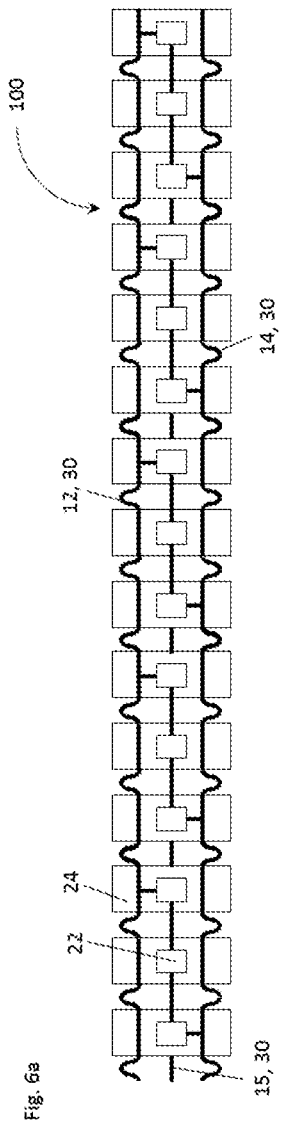
FIG. 6a shows the build-up of a longer group of three in line light-emitting diodes.

FIG. 6a shows the build-up of a longer group of three in line light-emitting diodes 22.

Figure 6B:
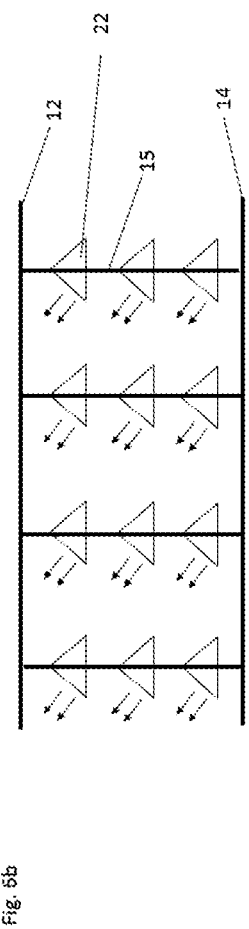

FIG. 6b shows the electrical scheme of light-emitting diode string of FIG. 6a.

Figure 7A:
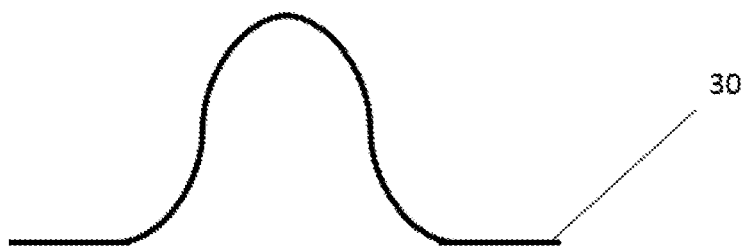
FIGS. 7a, 7b, and 7c show potential shapes of the connecting wire.
Figure 7B:
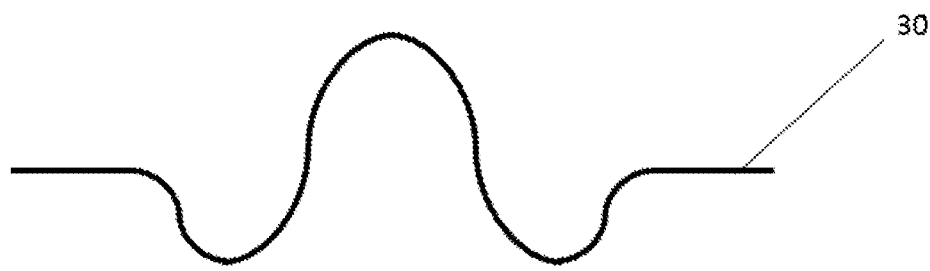
Figure 7C:
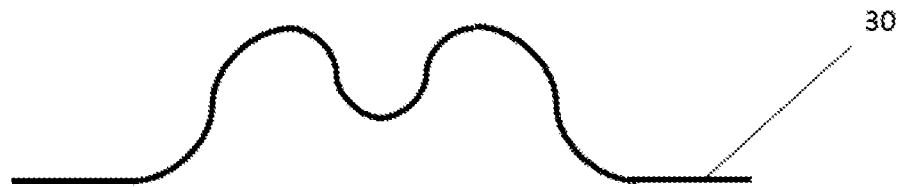

FIGS. 7a, 7b, and 7c show potential shapes of the wire 30 used in the outer lines 12, 14. The shapes shown in FIG. 7b and FIG. 7c are more suited as they can compensate compressive and tensile stress. Using a circular form of the wire 30, forces imposed on the flexible lighting strip 100 during thermomechanical cycle stress testing are withstood and absorbed better as it can be done by a square lead frame line.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

The invention claimed is:

1. A flexible lighting strip comprising:
   a first group of serially connected light-emitting diodes including one interposer of a plurality of interposers for each of the light-emitting diodes;
   a second group of serially connected light-emitting diodes including one interposer of the plurality of interposers for each of the light-emitting diodes, the second group of serially connected light-emitting diodes in a longitudinal arrangement with the first group such that a last light-emitting diode of the first group is next to a first light-emitting diode of the second group, the first group and the second group being electrically parallel;
   an anode track and a cathode track arranged substantially parallel to the longitudinal arrangement and providing electrical connection to the first group and to the second group in parallel, the anode track and the cathode track including a wire having a substantially circular cross section being bent;
   a third wire line including a wire having a substantially circular cross section at a center line arranged between and approximately parallel to the anode track and the cathode track; and
   the plurality of interposers, each of which has electrical coupling pads on both sides thereof to electrically connect with the at least one light-emitting diode mounted thereon, the anode track, the cathode track and the third wire line, providing electrical connection to the mounted light-emitting diode.

2. The flexible lighting strip according to claim 1, wherein the interposer has two electrical coupling pads on a first side for connection to the light-emitting diode.

3. The flexible lighting strip according to claim 2, wherein the interposer has four coupling pads on a second side for connection to the wires.

4. The flexible lighting strip according to claim 3, wherein the two coupling pads on the first side of the interposer are connected to two of the coupling pads of the second side of the interposer via vias.

5. The flexible lighting strip according to claim 1, wherein the anode track and the cathode track point outwards in one plane.

6. The flexible lighting strip according to claim 5, wherein the third wire line has at least one bent wire segment protruding from the plane defined by the anode track and the cathode track.

7. The flexible lighting strip according to claim 5, wherein the third wire line has at least one bent wire segment perpendicular to the plane defined by the anode track and the cathode track.

8. The flexible lighting strip according to claim 1, wherein three light-emitting diodes are connected in series between the anode track and the cathode track, a first light-emitting diode connects the anode track to a first inner segment of the third wire line, and the first inner segment connects via a second light-emitting diode to a second inner segment of the third wire line, and the second inner segment connects via a third light-emitting diode to the cathode track.

9. The flexible lighting strip according to claim 1, wherein all light emitting diodes are mounted on interposers.

10. The flexible lighting strip according to claim 1, wherein a routing for electrical connection is different for at least two interposers in the group.

11. The flexible lighting strip according to claim 1, wherein at least one group of two or more light-emitting diodes and three different kinds of interposers with varied electrical routings are integrated.

12. The flexible lighting strip according to claim 1, wherein the third wire line has a substantially circular wire that is segmented.

13. The flexible lighting strip according to claim 1, wherein the third wire line is substantially made from straight wire segments.

14. The flexible lighting strip according to claim 1, wherein the third wire line is substantially made from bent wire segments.

15. The flexible lighting strip according to claim 1, wherein the interposer is made out of a printed Circuit Board (PCB).

16. The flexible lighting strip according to claim 1, wherein the interposer is made out of a ceramic material.

17. The flexible lighting strip according to claim 1, wherein one of the interposers is positioned at one outer end of all groups and is connected to an external power line.

18. The flexible lighting strip according to claim 1, wherein the light-emitting diode and the wire are soldered to the interposer, and at least one solder point is double re-flown.

19. A vehicle light assembly comprising the flexible lighting strip according to claim 1, wherein the vehicle light assembly comprises an electrical interface and the electrical interface is arranged to couple the vehicle light assembly to an external power supply.

\* \* \* \* \*